(12) United States Patent
Aizawa et al.

(10) Patent No.: US 11,233,302 B2
(45) Date of Patent: Jan. 25, 2022

(54) NOISE FILTER DEVICE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Takeshi Aizawa, Mie (JP); Asato Hibino, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/053,444

(22) PCT Filed: Apr. 25, 2019

(86) PCT No.: PCT/JP2019/017565
§ 371 (c)(1),
(2) Date: Nov. 6, 2020

(87) PCT Pub. No.: WO2019/220909
PCT Pub. Date: Nov. 21, 2019

(65) Prior Publication Data
US 2021/0226309 A1    Jul. 22, 2021

(30) Foreign Application Priority Data
May 16, 2018   (JP) ............................. JP2018-094474

(51) Int. Cl.
*H01P 1/20* (2006.01)

(52) U.S. Cl.
CPC ...................................... *H01P 1/20* (2013.01)

(58) Field of Classification Search
CPC ........................................................ H01P 1/20
(Continued)

(56) References Cited

U.S. PATENT DOCUMENTS

2001/0052334 A1   12/2001   Nozaki et al.
2015/0333720 A1   11/2015   Saitou et al.

FOREIGN PATENT DOCUMENTS

JP    2010-113925 A    5/2010
JP    2016-208487 A    12/2016

OTHER PUBLICATIONS

International Search Report dated Jul. 2, 2019 for WO 2019/220909 A1.

*Primary Examiner* — Robert J Pascal
*Assistant Examiner* — Kimberly E Glenn
(74) *Attorney, Agent, or Firm* — Abelman, Frayne & Schwab

(57) ABSTRACT

Provided is a noise filter device that is capable of suppressing electrical interference between an input-side conductive line and an output-side conductive line. A noise filter device (10) includes: a noise filter (50) connected to a distal end of an input-side conductive line (41) and a distal end of an output-side conductive line (42); and a holding member (60) that holds the input-side conductive line (41) and the output-side conductive line (42). The holding member (60) includes: a body (61) attached to a wire harness (WH) so as to surround an outer circumference thereof; and a pair of hooks (62) that are respectively formed at two ends of the body (61) in a circumferential direction thereof, and are hooked on the input-side conductive line (41) and the (Continued)

output-side conductive line (42) to restrict the input-side conductive line (41) and the output-side conductive line (42) from approaching each other.

4 Claims, 4 Drawing Sheets

(58) Field of Classification Search
USPC .......................................................... 333/202
See application file for complete search history.

NOISE FILTER DEVICE

CROSS REFERENCE TO RELATED APPLICATIONS

This application is a national phase of PCT application No. PCT/JP2019/017565, filed on 25 Apr. 2019, which claims priority from Japanese patent application No. 2018-094474, filed on 16 May 2018, all of which are incorporated herein by reference.

TECHNICAL FIELD

The present invention relates to a noise filter device.

BACKGROUND

A noise filter according to Patent Document 1 is configured to be provided between two conductive lines. This noise filter includes a housing, a ground conductor, a first conductor, and a second conductor. The housing houses the ground conductor, the first conductor, and the second conductor. The ground conductor includes a contact portion that comes into electrical contact with a conductive member such as a vehicle body. The first conductor is connected to a conductive line (e.g. an input-side conductive line) that is led into the housing through one insertion hole provided in one surface of the housing. The second conductor is connected to a conductive line (e.g. an output-side conductive line) that is led into the housing through the other insertion hole provided in one surface of the housing. The ground conductor is connected to the first conductor and the second conductor via capacitors.

PRIOR ART DOCUMENT

Patent Document

Patent Document 1: JP 2016-208487A

SUMMARY OF THE INVENTION

Problems to be Solved

In the noise filter according to Patent Document 1, the input-side conductive line and the output-side conductive line, which are led out from one surface of the housing, are both made of flexible electrical wires, and therefore they may be routed close to each other. If the input-side conductive line and the output-side conductive line are too close to each other, signal leakage may occur between the conductive lines, and electrical interference such as crosstalk may occur.

The present invention has been completed in view of the above-described circumstances, and a problem to be solved is to provide a noise filter device that is capable of suppressing electrical interference between an input-side conductive line and an output-side conductive line.

Means to Solve the Problem

A noise filter device according to the present invention includes:

a connector that houses an input-side terminal connected to a proximal end of an input-side conductive line that is flexible, and an output-side terminal connected to a proximal end of an output-side conductive line that is flexible, and is connected to a harness-side conductive line included in a wire harness;

a noise filter connected to a distal end of the input-side conductive line and a distal end of the output-side conductive line; and a holding member that holds the input-side conductive line and the output-side conductive line, wherein the holding member includes:

a body attached to the wire harness so as to surround an outer circumference thereof; and a pair of hooks that are respectively formed at two ends of the body in a circumferential direction thereof, and are hooked on the input-side conductive line and the output-side conductive line to restrict the input-side conductive line and the output-side conductive line from approaching each other.

Effect of the Invention

In the noise filter device, a holding member that holds an input-side conductive line and an output-side conductive line includes a body that surrounds a wire harness. Therefore, the holding member can be stably attached to the wire harness. In addition, the holding member includes a pair of hooks that are respectively formed at two ends of the body thereof, and are respectively hooked on the input-side conductive line and the output-side conductive line to prevent the conductive lines from approaching each other. Thus, compared to a configuration without a holding member, the noise filter device can secure a large distance between the input-side conductive line and the output-side conductive line, and suppress electrical interference such as crosstalk occurring between the conductive lines.

DETAILED DESCRIPTION TO EXECUTE THE INVENTION

According to the present invention, the holding member may be elastic so as to bias the input-side conductive line and the output-side conductive line in directions away from each other.

With this configuration, the input-side conductive line and the output-side conductive line are each elastically pulled by the holding member in a direction away from the other conductive line. Therefore, it is possible to keep the conductive lines in the state of being biased in directions away from each other so the conductive lines are more likely to be distanced from each other.

According to the present invention, the body may be constituted by one elongated member, and the pair of hooks thereof may be respectively wound around the input-side conductive line and the output-side conductive line.

With this configuration, the body of the holding member is constituted by one elongated member and accordingly has a simple configuration. In addition, the pair of hooks are respectively wound around the input-side conductive line and the output-side conductive line, and thus the pair of hooks can be stably hooked on the respective conductive lines.

According to the present invention, the body may include a pair of body pieces extending in a circumferential direction of the wire harness in parallel, and a pair of joints each joining either proximal ends or distal ends of the pair of body pieces each other, and the hooks may respectively extend from the joints and respectively sandwich the input-side conductive line and the output-side conductive line, together with the pair of body pieces.

With this configuration, the hooks of the holding member respectively sandwich the input-side conductive line and the output-side conductive line, together with the pair of body pieces, and are thus hooked on the input-side conductive line and the output-side conductive line more firmly and are prevented from being detached from the input-side conductive line and the output-side conductive line due to impact or the like applied thereto.

First Embodiment

Hereinafter, a first embodiment that embodies a noise filter device according to the present invention will be described with reference to FIGS. 1 and 2.

Figure 1:
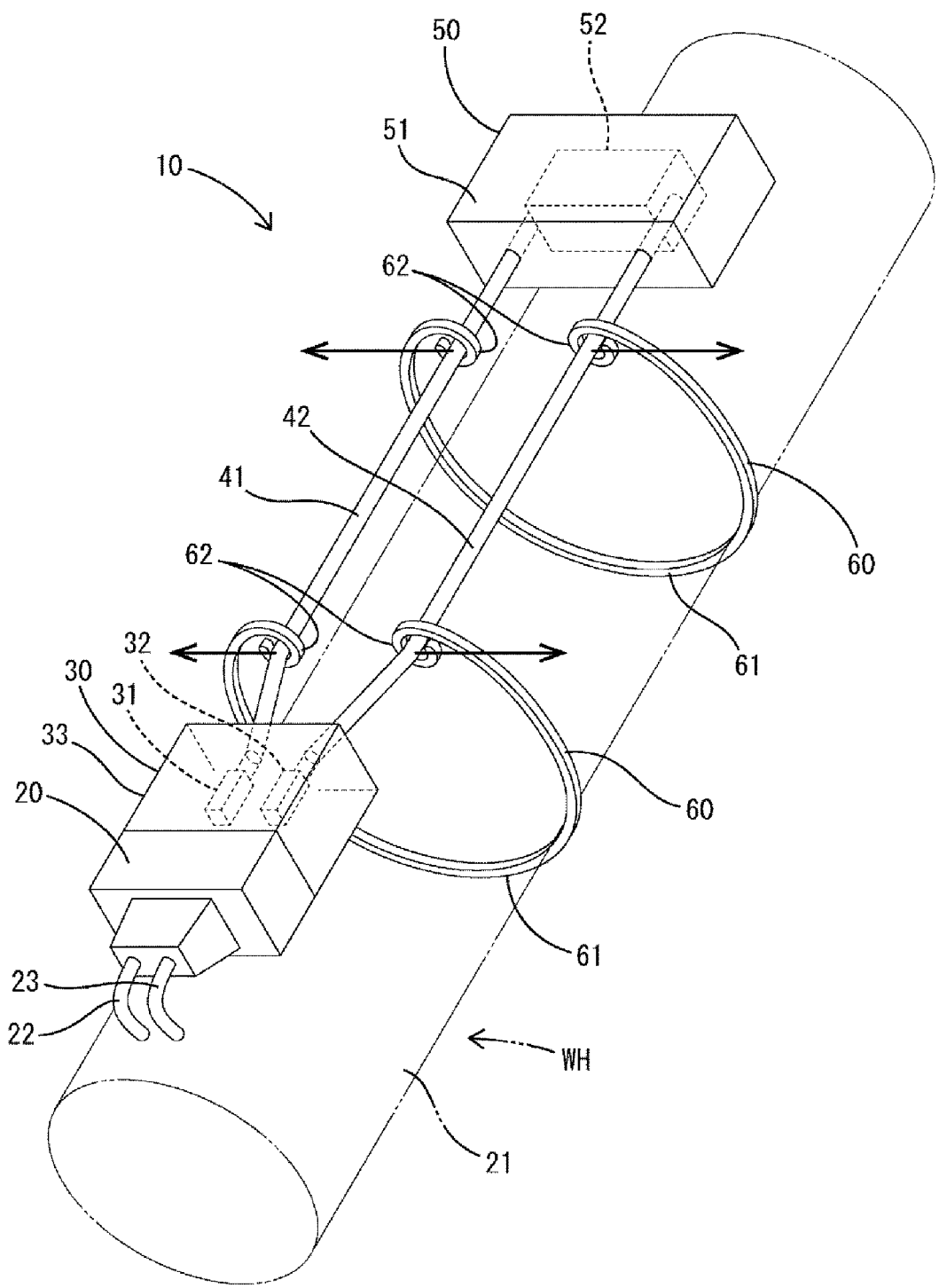
FIG. 1 is a perspective view showing a state in which a noise filter device according to a first embodiment is attached to a wire harness.

A noise filter device 10 according to the first embodiment is attached to a wire harness WH as shown in FIG. 1. The noise filter device 10 functions to remove electrical noise generated in the wire harness WH. The wire harness WH includes a plurality of coated electrical wires (conductive lines) coated with an insulating member. In the wire harness WH, a plurality of coated electrical wires are integrally coated with an insulating member. The wire harness WH includes a trunk line 21 and harness-side conductive lines 22 and 23. The trunk line 21 is formed by bundling a plurality of conductive lines together. The harness-side conductive lines 22 and 23 are a pair of conductive lines branching from the trunk line 21. The wire harness WH is provided with a harness-side connector 20. The harness-side connector 20 includes a pair of terminal fittings (not shown) to which the harness-side conductive lines 22 and 23 are respectively connected. The harness-side connector 20 houses the pair of terminal fittings such that the harness-side conductive lines 22 and 23 are led out from the harness-side connector 20. The harness-side connector 20 is disposed adjacent to the trunk line 21 such that the harness-side conductive lines 22 and 23 are bent.

As shown in FIG. 1, the noise filter device 10 includes a filter-side connector 30 (which is equivalent to the "connector" according to the present invention), an input-side conductive line 41, an output-side conductive line 42, a noise filter 50, and a pair of holding members 60. Although FIG. 1 illustrates a configuration in which the noise filter device 10 includes a pair of holding members 60, the noise filter device 10 may include a different number of holding members 60 such as one holding member 60 or three or more holding members 60.

As shown in FIG. 1, the filter-side connector 30 includes an input-side terminal 31, an output-side terminal 32, and a case 33. The input-side terminal 31 is connected to a proximal end of the input-side conductive line 41. The output-side terminal 32 is connected to a proximal end of the output-side conductive line 42. The input-side conductive line 41 and the output-side conductive line 42 are coated electrical wires, and are flexible. The case 33 is made of a synthetic resin, for example, and has a box shape. Insertion holes (not shown) into which the input-side conductive line 41 and the output-side conductive line 42 are inserted are formed in the case 33. The case 33 houses the input-side terminal 31 such that a distal end-side portion of the input-side conductive line 41 is led out from the case 33. The case 33 houses the output-side terminal 32 such that a distal end-side portion of the output-side conductive line 42 is led out from the case 33.

As shown in FIG. 1, the filter-side connector 30 is connected to the harness-side connector 20. The input-side terminal 31 and the output-side terminal 32 are respectively connected to a pair of terminal fittings (not shown) of the harness-side connector 20. Thus, the input-side conductive line 41 and the output-side conductive line 42 are electrically connected to the harness-side conductive lines 22 and 23, respectively. The input-side conductive line 41 and the output-side conductive line 42 are adjacent to each other with a predetermined distance therebetween so as to be parallel with the trunk line 21.

As shown in FIG. 1, the noise filter 50 is connected to the distal end of the input-side conductive line 41 and the distal end of the output-side conductive line 42. The noise filter 50 includes a case 51 and a capacitor 52. The case 51 houses the capacitor 52. The case 51 is made of a synthetic resin, for example. The capacitor 52 is a film capacitor, for example. One electrode of the capacitor 52 is electrically connected to the distal end of the input-side conductive line 41. The other electrode of the capacitor 52 is electrically connected to the distal end of the output-side conductive line 42.

As shown in FIG. 1, the holding members 60 hold the input-side conductive line 41 and the output-side conductive line 42. As shown in FIGS. 1 and 2, each holding member 60 is formed into a substantially arc-like shape, using an elastically deformable material (for example, rubber or resin). Each holding member 60 includes a body 61 and a pair of hooks 62. The body 61 is formed into an arc shape (a substantially C-like shape), using one elongated member. Thus, the holding members 60 have a simple configuration. The body 61 is attached to the wire harness WH so as to surround the outer circumference thereof. In other words, the body 61 is wound around the wire harness WH along the outer circumference thereof. Therefore, each holding member 60 is stably attached to the wire harness WH.

Figure 2:
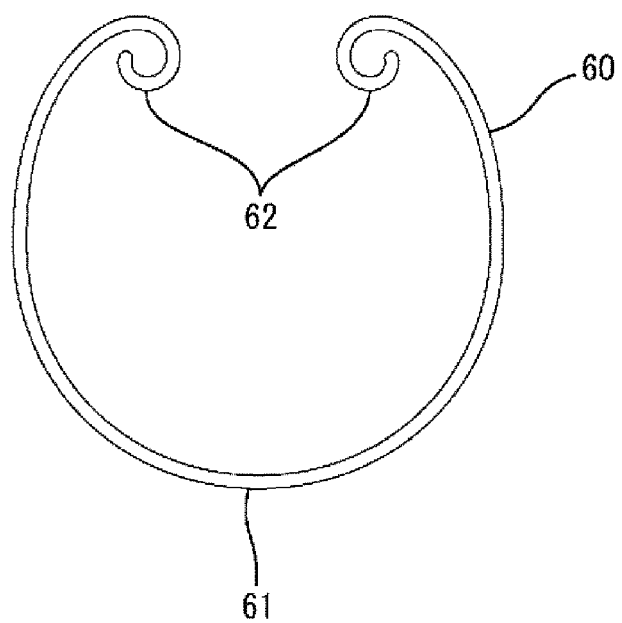
FIG. 2 is a plan view of the holding member shown in FIG. 1.

As shown in FIGS. 1 and 2, the pair of hooks 62 are respectively formed at the two ends of each body 61 in the circumferential direction thereof. The hooks 62 have an arc shape (a substantially C-like shape) with a diameter smaller than the diameter of the arc of the body 61. The hooks 62 are formed so as to be wound inward in the circumferential direction of the body 61. The outer circumference of the body 61 and the outer circumferences of the hooks 62 are seamlessly joined to each other. The pair of hooks 62 are respectively wound around the input-side conductive line 41 and the output-side conductive line 42 from the outside in a radial direction of the wire harness WH. Therefore, the pair of hooks 62 can be stably hooked on the input-side conductive line 41 and the output-side conductive line 42, respectively.

The curvature of the holding members 60 in the free state thereof (the state of being not elastically deformed) is smaller than the curvature of the outer circumference of the wire harness WH. Therefore, in the state of being attached to the outer circumference of the wire harness WH, the holding members 60 exhibit elasticity to bias the input-side conductive line 41 and the output-side conductive line 42 in directions away from each other (the directions indicated by the arrows in FIG. 1). Therefore, the holding members 60 can stably maintain a state in which the input-side conductive line 41 and the output-side conductive line 42 are biased in directions away from each other (the directions indicated by the arrows in FIG. 1). As shown in FIG. 1, the pair of hooks 62 are respectively hooked on the input-side conductive line 41 and the output-side conductive line 42 to restrict the input-side conductive line 41 and the output-side conductive line 42 from approaching each other.

The input-side conductive line 41 and the output-side conductive line 42, which are led out from one surface of the filter-side connector 30, are both flexible, and therefore they may be routed close to each other. If the input-side conductive line 41 and the output-side conductive line 42 are too close to each other, signal leakage may occur between the conductive lines 41 and 42, and electrical interference such as crosstalk may occur. However, as described above, in the noise filter device 10 according to the first embodiment, the holding members 60 are respectively hooked on the input-side conductive line 41 and the output-side conductive line 42 to restrict the input-side conductive line 41 and the output-side conductive line 42 from approaching each other. Thus, compared to a configuration without a holding member 60, the noise filter device 10 can secure a large distance between the input-side conductive line 41 and the output-side conductive line 42, and suppress electrical interference such as crosstalk occurring between the conductive lines 41 and 42.

A piece of adhesive tape, for example, is wound around the noise filter device 10 in a state of being attached to the wire harness WH. Specifically, a piece of adhesive tape is wound around the input-side conductive line 41, the output-side conductive line 42, and the wire harness WH. At this time, the input-side conductive line 41 and the output-side conductive line 42 are stably held by the holding members 60 relative to the wire harness WH. Therefore, the input-side conductive line 41 and the output-side conductive line 42 are unlikely to be displaced when a piece of adhesive tape is wound around them.

As described above, the wire harness WH is formed by bundling up a plurality of coated electrical wires (conductive lines) coated with an insulating member. Therefore, the noise filter device 10 can reduce the AC resistance by the skin effect of each coated electric wire, and improve the noise removal function. Therefore, with the noise filter device 10, it is unnecessary to upsize the capacitor 52 to improve the noise removal function.

As described above, in the noise filter device 10 according to the first embodiment, the holding members 60 that hold the input-side conductive line 41 and the output-side conductive line 42 each have the body 61 that surrounds the wire harness WH. Therefore, the holding members 60 can be stably attached to the wire harness WH. In addition, each holding member 60 includes a pair of hooks 62 that are respectively formed at two ends of the body 61 thereof, and are respectively hooked on the input-side conductive line 41 and the output-side conductive line 42 to prevent the conductive lines from approaching each other. Thus, compared to a configuration without a holding member 60, the noise filter device 10 can secure a large distance between the input-side conductive line 41 and the output-side conductive line 42, and suppress electrical interference such as crosstalk occurring between the conductive lines 41 and 42.

Also, the holding members 60 are elastic so as to bias the input-side conductive line 41 and the output-side conductive line 42 in directions away from each other.

With this configuration, the input-side conductive line 41 and the output-side conductive line 42 are each elastically pulled by the holding members 60 in a direction away from the other conductive line. Therefore, it is possible to keep the conductive lines 41 and 42 in the state of being biased in directions away from each other so the conductive lines are more likely to be distanced from each other.

In addition, each body 61 is constituted by one elongated member, and the pair of hooks 62 thereof are respectively wound around the input-side conductive line 41 and the output-side conductive line 42.

With this configuration, the body 61 of each holding member 60 is constituted by one elongated member and accordingly has a simple configuration. In addition, the pair of hooks 62 are respectively wound around the input-side conductive line 41 and the output-side conductive line 42, and thus the pair of hooks 62 can be stably hooked on the respective conductive lines.

Second Embodiment

Next, a second embodiment that embodies the present invention will be described with reference to FIGS. 3 and 4. In the noise filter device 10 according to the second embodiment, the configuration of holding members 260 is different from the configuration in the above-described first embodiment. Other components are the same as those in the above-described first embodiment, and therefore the same components are given the same reference numerals, and descriptions of the configurations, actions, and effects thereof are omitted. Although FIG. 3 illustrates a configuration in which the noise filter device 10 includes one holding member 260, the noise filter device 10 may include a different number of holding members 260.

Figure 3:
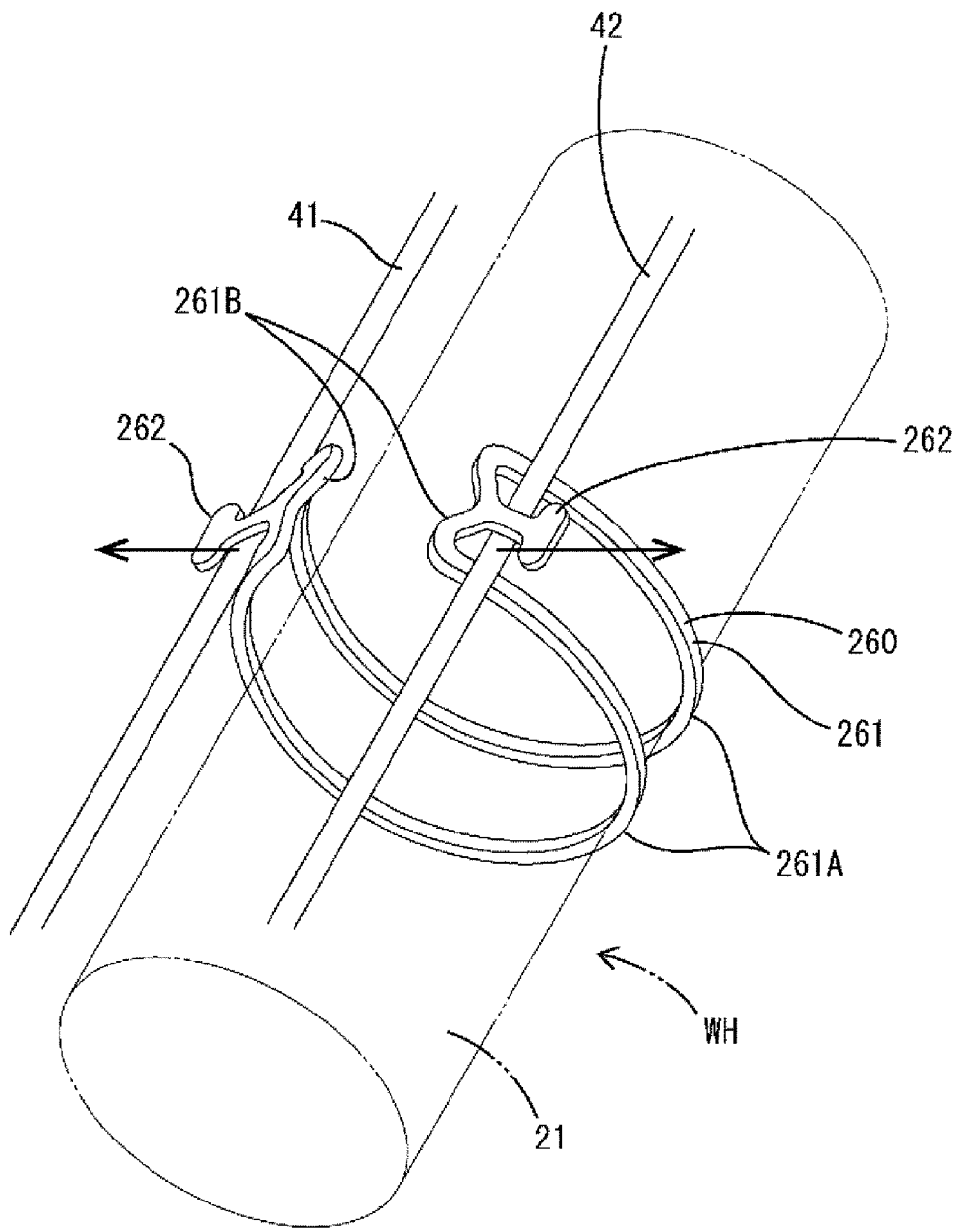
FIG. 3 is a perspective view showing a state in which a holding member according to a second embodiment is attached to a wire harness, an input-side conductive line, and an output-side conductive line.

As shown in FIG. 3, the holding member 260 holds the input-side conductive line 41 and the output-side conductive line 42. As shown in FIGS. 3 and 4, the holding member 260 is formed into an elongated ring shape, using an elastically deformable material (for example, rubber or resin). The holding member 260 includes a body 261 and a pair of hooks 262. The body 261 includes a pair of body pieces 261A and a pair of joints 261B. Each body piece 261A has an elongated band plate shape. The body pieces 261A are attached to the wire harness WH so as to surround the outer circumference thereof. In other words, the pair of body pieces 261A extend in a circumferential direction of the wire harness WH in parallel. Therefore, the holding member 260 is stably attached to the wire harness WH.

Figure 4:
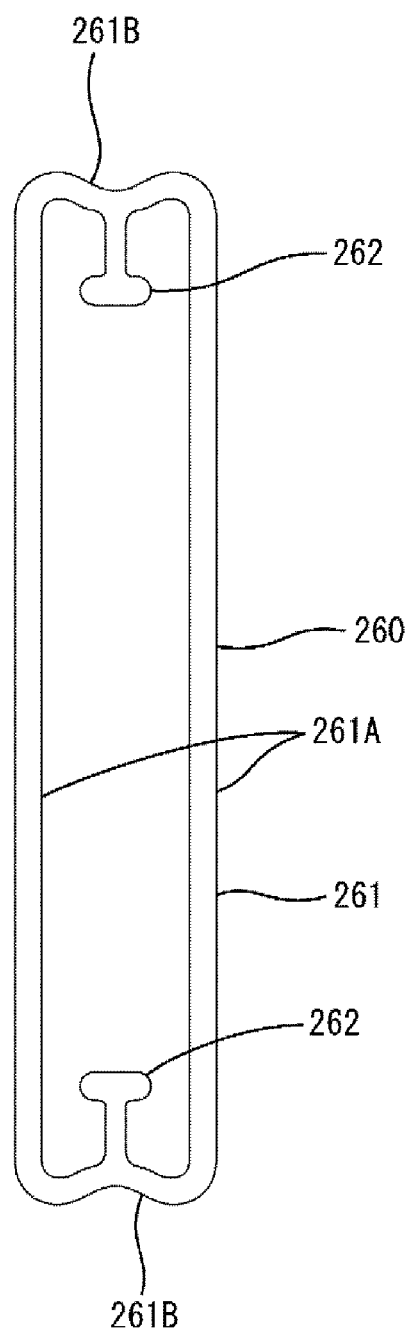
FIG. 4 is a plan view of the holding member shown in FIG. 3.

As shown in FIGS. 3 and 4, the pair of joints 261B each join either the proximal ends or distal ends of the pair of body pieces 261A. As shown in FIG. 4, a central portion of each joint 261B is curved so as to protrude toward the other joint 261B in a state where the body pieces 261A extend straight. End portions of each joint 261B are curved so as to protrude in a direction away from the other joint 261B in a state where the body pieces 261A extend straight.

As shown in FIG. 4, each hook 262 is disposed so as to extend from a central portion of one joint 261B toward the other joint 261B, and so as to be sandwiched between a pair of body pieces 261A. The leading end portion of each hook 262 is wider than the base end portion thereof. One hook 262 and the pair of body pieces 261A sandwich the input-side conductive line 41 in a radial direction of the wire harness WH. Specifically, one hook 262 is attached to the input-side conductive line 41 from the output-side conductive line 42 side in a circumferential direction of the wire harness WH, and is in contact with the input-side conductive line 41 from the outside in a radial direction. The pair of body pieces 261A are in contact with the input-side conductive line 41 from the inside (the output-side conductive line 42 side). The other hook 262 and the pair of body pieces 261A sandwich the output-side conductive line 42 in a radial direction of the wire harness WH. Specifically, the other hook 262 is attached to the output-side conductive line 42 from the input-side conductive line 41 side in a circumferential direction of the wire harness WH, and is in contact with the output-side conductive line 42 from the outside in a radial direction. The pair of body pieces 261A are in contact with the output-side conductive line 42 from the inside (the input-side conductive line 41 side).

The holding member 260 exhibits elasticity to bias the input-side conductive line 41 and the output-side conductive line 42 in directions away from each other (the directions indicated by the arrows in FIG. 3). Therefore, the holding member 260 can stably maintain a state in which the input-side conductive line 41 and the output-side conductive line 42 are biased in directions away from each other (the directions indicated by the arrows in FIG. 3). As shown in FIG. 3, the pair of hooks 262 are respectively hooked on the input-side conductive line 41 and the output-side conductive line 42 to restrict the input-side conductive line 41 and the output-side conductive line 42 from approaching each other. In particular, the holding member 260 is configured such that the hooks 262 and the pair of body pieces 261A sandwich the input-side conductive line 41 and the output-side conductive line 42. Therefore, compared to the configuration in which one body piece 261A is in contact with the conductive lines, the holding member 260 can be more firmly hooked on the conductive lines, and is prevented from being detached from the conductive lines due to impact or the like applied thereto.

As described above, in the noise filter device 10 according to the second embodiment, the holding member 260 is hooked on the input-side conductive line 41 and the output-side conductive line 42 to restrict the input-side conductive line 41 and the output-side conductive line 42 from approaching each other. Thus, compared to a configuration without a holding member 260, the noise filter device 10 can secure a large distance between the input-side conductive line 41 and the output-side conductive line 42, and prevent electrical interference such as crosstalk from occurring between the conductive lines 41 and 42.

As described above, in the noise filter device 10 according to the second embodiment, the body 261 includes body pieces 261A and a pair of joints 261B. The body pieces 261A extend in a circumferential direction of the wire harness WH in parallel. The pair of joints 261B each join either the proximal ends or distal ends of the pair of body pieces 261A. The hooks 262 extend from the joints 261B, and sandwich the input-side conductive line 41 and the output-side conductive line 42, together with the pair of body pieces 261A.

With this configuration, in the holding member 260, the hooks 262 sandwich the input-side conductive line 41 and the output-side conductive line 42, together with the pair of body pieces 261A, and are thus hooked on the input-side conductive line 41 and the output-side conductive line 42 more firmly, and are prevented from being detached from the input-side conductive line 41 and the output-side conductive line 42 due to impact or the like applied thereto.

With this configuration, in the holding member 60, the hooks 62 sandwich the input-side conductive line 41 and the output-side conductive line 42, together with the pair of body pieces 261A, and are thus hooked on the input-side conductive line 41 and the output-side conductive line 42 more firmly, and are prevented from being detached from the input-side conductive line 41 and the output-side conductive line 42 due to impact or the like applied thereto.

Other Embodiments

The present invention is not limited to the above descriptions or the embodiments described with reference to the drawings, and, for example, the following embodiments are included in the technical scope of the present invention.

(1) In the above first embodiment, the outer circumferences of the hooks 62 of each holding member 60 are seamlessly joined to the outer circumference of the body 61. However, the outer circumferences of the hooks 62 may be seamlessly joined to the inner circumference of the body 61. In other words, the hooks 62 may be wound around the conductive lines 41 and 42 from the inside in a radial direction of the wire harness WH.

(2) In the above second embodiment, the leading end portion of each hook 262 of the holding member 260 is wider than the base end portion thereof. However, another configuration may be employed. For example, each hook 262 may have an elongated band plate shape, and the leading end portion thereof may be thicker than the base end portion thereof. As a result, the leading end portions of the hooks 262 are more easily hooked on the input-side conductive line 41 and the output-side conductive line 42.

(3) In the above first and second embodiments, the noise filter 50 includes the capacitor 52. However, another configuration may be employed. For example, the noise filter 50 may be a 7E filter that includes two capacitors and one coil. Alternatively, the noise filter 50 may be an L type filter that includes one capacitor and one coil. Alternatively, the noise filter 50 may be a T type filter that includes one capacitor and two coils.

(4) In the above first and second embodiments, a film capacitor is used as the capacitor 52. However, an electrolytic capacitor or a ceramic capacitor may be used instead.

LIST OF REFERENCE NUMERALS

10: Noise Filter Device
22, 23: Harness-side Conductive line
30: Filter-side Connector (Connector)
31: Input-side Terminal
32: Output-side Terminal
41: Input-side Conductive line
42: Output-side Conductive line
50: Noise Filter
60, 260: Holding Member
61, 261: Body
62, 262: Hook
261A: Body Piece
261B: Joint
WH: Wire Harness

What is claimed is:
1. A noise filter device comprising:
a connector that houses an input-side terminal connected to a proximal end of an input-side conductive line that is flexible, and an output-side terminal connected to a proximal end of an output-side conductive line that is flexible, and is connected to a harness-side conductive line included in a wire harness;

a noise filter connected to a distal end of the input-side conductive line and a distal end of the output-side conductive line; and a holding member that holds the input-side conductive line and the output-side conductive line, wherein the holding member includes:

a body attached to the wire harness so as to surround an outer circumference thereof; and a pair of hooks that are respectively formed at two ends of the body in a circumferential direction thereof, and are hooked on the input-side conductive line and the output-side conductive line to restrict the input-side conductive line and the output-side conductive line from approaching each other.

2. The noise filter device according to claim 1, wherein the holding member is elastic so as to bias the input-side conductive line and the output-side conductive line in directions away from each other.

3. The noise filter device according to claim 1, wherein the body is constituted by one elongated member, and the pair of hooks are respectively wound around the input-side conductive line and the output-side conductive line.

4. The noise filter device according to claim 1, wherein the body includes:

a pair of body pieces extending in a circumferential direction of the wire harness in parallel; and a pair of joints each joining either proximal ends or distal ends of the pair of body pieces each other, and the hooks respectively extend from the joints and respectively sandwich the input-side conductive line and the output-side conductive line, together with the pair of body pieces.

\* \* \* \* \*